United States Patent
Childers

(10) Patent No.: US 7,187,180 B2
(45) Date of Patent: Mar. 6, 2007

(54) METHOD OF SENSING MOTOR WINDING CURRENT IN INTEGRATED STEPPER MOTOR BUFFER

(75) Inventor: Jim D. Childers, Missouri City, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 11/343,762

(22) Filed: Jan. 31, 2006

(65) Prior Publication Data

US 2006/0170448 A1    Aug. 3, 2006

Related U.S. Application Data

(60) Provisional application No. 60/648,814, filed on Jan. 31, 2005.

(51) Int. Cl.
*G01R 15/12* (2006.01)
(52) U.S. Cl. .............. 324/522; 324/772; 324/769; 324/177
(58) Field of Classification Search .......... 324/772, 324/120, 177, 769
See application file for complete search history.

(56) References Cited

U.S. PATENT DOCUMENTS 5,773,991 A * 6/1998 Chen ..................... 324/772
5,867,001 A * 2/1999 Lagerquist et al. ......... 318/439
5,959,417 A * 9/1999 Maggio et al. ............. 318/254
7,034,542 B2 * 4/2006 Peterson .................... 324/522
7,068,062 B2 * 6/2006 Kitagawa et al. .......... 324/772

FOREIGN PATENT DOCUMENTS

JP        02073598 A  *  3/1990

* cited by examiner

*Primary Examiner*—Andrew H. Hirshfeld
*Assistant Examiner*—John Zhu
(74) *Attorney, Agent, or Firm*—Robert D. Marshall, Jr.; W. James Brady; Frederick J. Telecky, Jr.

(57) ABSTRACT

A method and motor controller for sensing motor winding current. An FET drive transistor has its ON resistance periodically increased to about five times the normal ON resistance for short sensing intervals during motor drive. An analog-to-digital converting senses the voltage across this FET during the sensing intervals. The resulting digital signal is used to calculate motor current. The time at high ON resistance is much less than the time at normal. The ON resistance can be changed using two FETs or one FET with gate fingers over differing parts of the channel region.

10 Claims, 2 Drawing Sheets

METHOD OF SENSING MOTOR WINDING CURRENT IN INTEGRATED STEPPER MOTOR BUFFER

CLAIM OF PRIORITY

This application claims priority under 35 U.S.C. 119(e)(1) to U.S. Provisional Application No. 60/648,814 filed Jan. 31, 2005.

TECHNICAL FIELD OF THE INVENTION

The technical field of this invention is motor drive circuits and more particularly motor current sensing.

BACKGROUND OF THE INVENTION

Sensing current across a turned-on FET is a common practice in motor control applications. In the case of small stepper motors, this signal current is about 10 to 40 mA. This current level is too low to effectively sense across the 5 ohms ON resistance typical for an N-channel transistor. Digital current sensing thus typically requires amplification of this small signal before conversion by an analog-to-digital converter (ADC). The operational amplifier required for this amplification introduces additional expense into the motor control circuit.

SUMMARY OF THE INVENTION

This invention operates the N-channel FET in a novel manner to sense the stepping motor current. Initially, a large portion of the output transistor's gate is turned OFF. This raises the ON resistance to a minimum of 25 ohms. This increased resistance results in a signal 5 times larger than with a typical 5 ohm ON resistance. The output transistor is driven in this manner for the required settling time of the ADC. The ADC then samples the current. Then the entire output transistor is turned ON resulting in an ON resistance typically 5 ohms. The time for driving the stepper motor on step is 5 to 10 mS. The current measurement requires about 5 μS or less, which is about 0.1% or less of the stepping time. The loss of drive is not noticeable in stepping performance. The signal magnitude required for the current measurement is relative to other measurements taken near the same time. Thus the current measurement is self-calibrating. Variations in the ON resistance do not appreciably affect the calculated results.

BRIEF DESCRIPTION OF THE DRAWINGS

These and other aspects of this invention are illustrated in the drawings, in which.

DETAILED DESCRIPTION OF PREFERRED EMBODIMENTS

This invention raises the ON current of the sensing transistor during short intervals of the stepper motor drive. This greatly increases gain of the sensing circuit. As consequence an operational amplifier is not needed to boost the level of the current signal. The ON current is dynamically changed during the stepper motor drive. By operating mostly at the prior ON resistance, this invention has negligible effect on the stepping operation. This technique is vastly simpler than the prior art operational amplifier and has the same effect as amplification.

Figure 1:
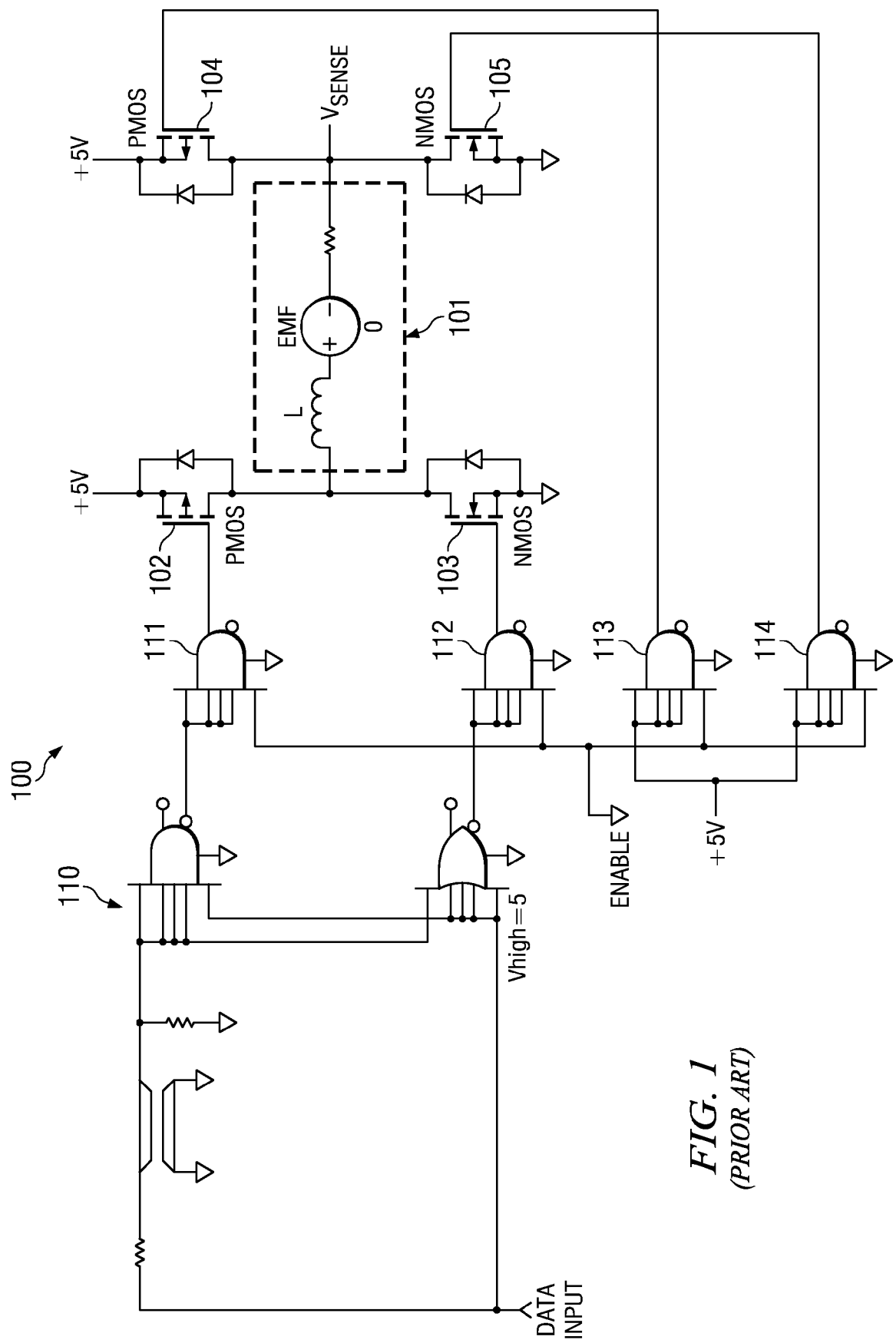
FIG. 1 illustrates a prior art current sensing technique applicable to a motor drive via an H bridge circuit.

FIG. 1 illustrates a prior art circuit 100 that uses ON current sensing. Load 101 including resistance R, inductance L and back-electromotive force voltage source EMF is in an H bridge configuration between four FET drive transistors. The four FET drive transistors are P-channel FET 102, N-channel FET 103, P-channel FET 104 and N-channel FET 105. These FETs are driven by drive circuit 110 including AND gates 111, 112, 113 and 114. In the typical circuit P-channel FET 104 and N-channel FET 105 are semi-statically driven via an enable input and AND gates 113 and 114. P-channel FET 102 and N-channel FET 103 are typically pulse width modulated (PWM) via a data input.

In the prior art technique, the current through load 101 is determined by sensing the voltage across N-channel FET 105 at the $V_{sense}$ terminal while N-channel FET 105 is ON. In the typical case the ON resistance of N-channel FET 105 is 5 ohms. For a typical load current of 10 to 40 mA this yields a sensing voltage at $V_{sense}$ of 50 to 200 mV. This voltage level is generally too small to be sensed directly by an ADC to generate a digital current signal for a digital microcontroller controlling the motor drive. The typical solution to this problem is to use an operational amplifier to amplify the analog voltage to a level readable by an ADC.

This invention proposes to momentarily increase the ON resistance of the N-channel FET to a higher value, such as 25 ohms. This change amplifies the voltage at $V_{sense}$ by a factor of 5 to 250 to 1000 mV. Voltages at this level are suitable for direct sensing by an ADC. This eliminates the need for an operational amplifier.

Figure 2:
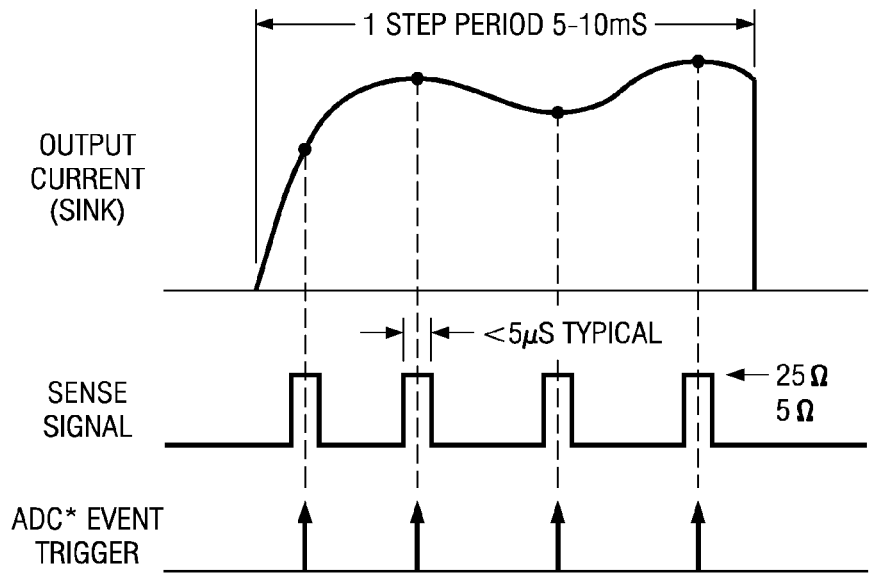
FIG. 2 illustrates the sensing intervals of this invention relative to the stepper pulse drive period.

This change in ON resistance could have an adverse effect on the motor drive performance. To minimize this problem, the time that the ON resistance remains at the increased level is minimized. This is illustrated in FIG. 2. The first curve is the load current during the typical 5 to 10 mS of a stepper pulse. The increased resistance is not needed for the entire pulse interval. The increased resistance need only be applied during the sampling/settling period of the ADC. For a typical ADC used for this purpose this period is much shorter than the stepper pulse interval. This period could be in the range of 5 μS or less. The lower curve in FIG. 2 shows periodic ADC samples. The ON resistance of the N-channel FET is increased to 25 ohms for these sampling periods as illustrated in middle curve of FIG. 2. Because the sampling interval is much shorter than the stepper pulse interval, the overall change observed by load 101 is virtually unchanged.

Figure 3:
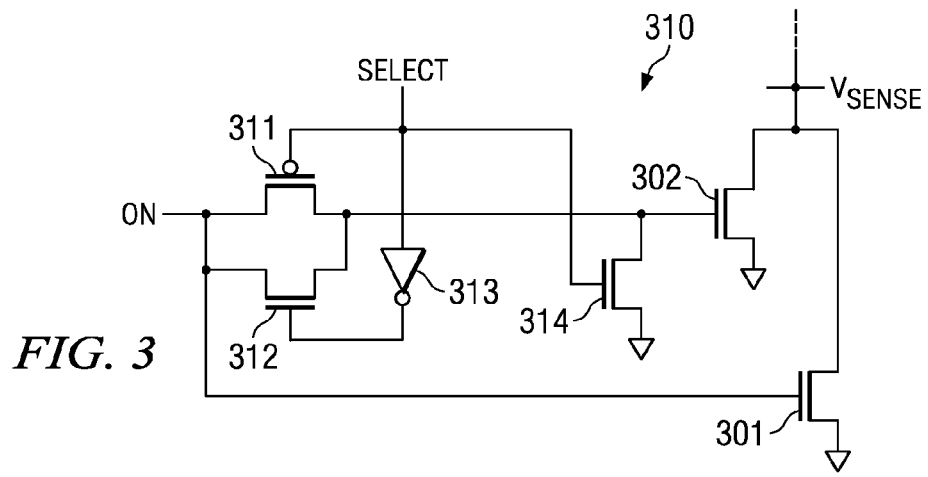
FIG. 3 illustrates a two FET manner of control of the ON resistance.

FIG. 3 illustrates a preferred manner of control of the ON resistance. FIG. 3 illustrates portions of the H bridge circuit illustrated in FIG. 1 necessary to understand this invention. N-channel FET 105 is replaced with N-channel FET 301 and N-channel FET 302. The ON drive signal is initially applied directly to the gate of N-channel FET 301 which turns ON immediately. N-channel FET 301 is constructed with a narrower channel than used for N-channel FET 105. If the channel width is one fifth as wide, N-channel FET 301 would have an ON resistance of five times as much, such as 25 ohms rather than 5 ohms.

N-channel FET 302 receives the ON drive signal via a select circuit 310 including P-channel FET 311, N-channel FET 312, inverter 313 and N-channel FET 314. With the select signal in a first state, both P-channel FET 311 and N-channel FET 312 are cut off and thus the ON signal does not reach the gate of N-channel FET 302. In addition, N-channel FET 314 is ON discharging the gate of N-channel FET 302 keeping it OFF. When the select signal is in an opposite second state, both P-channel FET 311 and N-channel FET 312 are conducting and thus the ON signal is applied to gate of N-channel FET 302. N-channel FET 314 is OFF and thus does not change the signal at the gate of N-channel FET 302. Thus the ON and OFF state of N-channel FET 302 is controlled by the select signal. This permits selective actuation of only N-channel FET 301 or of both N-channel FETs 301 and 302. The channel width of N-channel 302 is selected for an ON resistance of 6.25 ohms. When both N-channel FETs 301 and 302 are ON, the effective resistance is:

$$\frac{1}{\frac{1}{25}+\frac{1}{6.25}} = \frac{1}{\frac{1}{25}+\frac{4}{25}} = \frac{1}{\frac{5}{25}} = \frac{25}{5} = 5$$

Thus the circuit of FIG. 3 achieves the previous 5 ohm ON resistance when both N-channel FETs 301 and 302 are ON. The select signal is active only during the measurement interval illustrated in FIG. 2.

Gate fingers over the channel of the N-channel FET may be used to provide similar control. A first set of gate fingers over a first portion of the channel are initially activated. Following the ADC interval, a second set of additional gate fingers are also activated. Proper control of the channel width of these two sets of gate fingers permits ON resistance control similar to the two FET technique described above. This technique had almost zero increase in silicon cost. The FETs typically used in these applications include many gate fingers. This invention merely disables some of these existing gate fingers during the sampling interval.

Figure 4:
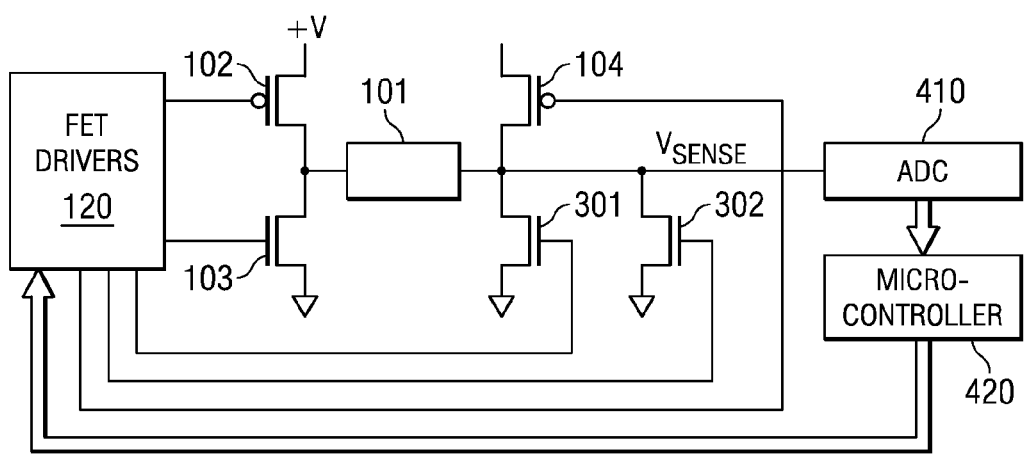
FIG. 4 illustrates the construction of the system of this invention.

FIG. 4 illustrates the construction of the system of this invention. FIG. 4 shows load 101 and FETs 102, 103, 104, 301 and 302 in the H bridge configuration as illustrated in FIG. 1. Analog-to-digital converter 410 receives the $V_{sense}$ signal and generates a digital output. FET drivers 120 controls the ON and OFF operation of these FETs based upon signals received from microcontroller 420. Microcontroller 420 is a programmable microprocessor or digital signal processor with memory and a program for the desired motor control. Microcontroller 420 calculates motor current by controlling FET drivers 120 to control FETs 301 and 302 as described above while triggering analog-to-digital converter 410 to sample and digitize $V_{sense}$.

What is claimed is:

1. A method of sensing motor winding current comprising the steps of:
   periodically during current drive
      increasing the ON resistance of a drive circuit driving the motor winding to a first level above a non-zero second level,
      measuring the voltage across the drive circuit,
      returning the ON resistance of the drive circuit to the second level, and
      calculating motor current from the measured voltage.

2. The method of claim 1, wherein:
   during each period a time during which the ON resistance is at said first level is much less than a time during which the ON resistance is at said second level.

3. The method of claim 1, wherein:
   the drive circuit includes a FET drive transistor having a plurality of gate fingers above a channel region;
   said step of increasing the ON resistance of the drive circuit includes supplying a gate drive signal to less than all the gate fingers of the FET drive transistor; and
   said step of returning the ON resistance of the drive circuit includes supplying a gate drive signal to all gate fingers of the FET drive transistor.

4. The method of claim 1, wherein:
   the drive circuit includes a first FET drive transistor and a second FET drive transistor connected in parallel with said first FET drive transistor;
   said step of increasing the ON resistance of the drive circuit includes supplying a gate drive signal to said first FET drive transistor and not to said second FET drive transistor; and
   said step of returning the ON resistance of the drive circuit includes supplying a gate drive signal to both said first FET drive transistor and said second FET drive transistor.

5. The method of claim 1, wherein:
   said first level of ON resistance is five times said second level of ON resistance.

6. A motor controller comprising:
   a plurality of drive circuits connected to a motor winding for driving the motor, one of said drive circuits being a current sensing drive circuit having a variable ON resistance;
   an analog-to-digital converter having an analog sensing input sensing a voltage across said current sensing drive circuit and a digital output corresponding to said voltage;
   a microcontroller connected to said plurality of drive circuits and said analog-to-digital converter, said microcontroller
      controlling ON and OFF operation of said plurality of drive circuits to control motor operation,
      said microcontroller further controlling said sensor drive circuit to periodically have a high ON resistance during ON operation during a sensing interval and otherwise have a non-zero normal ON resistance,
      controlling said analog-to-digital converter to sense said voltage during said sensing interval, and
      calculating a motor current from said digital output of said analog-to-digital converter.

7. The motor controller of claim 6, wherein:
   said microcontroller controls said sensing drive circuit whereby said sensing drive circuit has said high ON resistance for much less time than said sensing drive circuit has said normal ON resistance.

8. The motor controller of claim 6, wherein:
   said sensing drive circuit includes a sensing FET drive transistor having a plurality of gate fingers covering a channel region; and
   said microcontroller controls said sensing FET drive transistor to have said high ON resistance by supplying a gate drive signal to less than all said gate fingers and controls said sensing FET drive transistor to have said normal ON resistance by supplying a gate drive signal to all said gate fingers.

9. The motor controller of claim 6, wherein:
   aid sensing drive circuit includes a first FET drive transistor having a first ON resistance equal to said high ON resistance and a second FET drive transistor disposed in parallel with said first FET drive transistor having a second ON resistance, said first ON resistance and said second ON resistance in parallel equal to said low ON resistance; and said motor controller controls said sensing drive circuit to have said high ON resistance by supplying a gate drive signal to said first FET drive transistor and not to said second FET drive transistor and controls said sensing drive circuit to have said normal ON resistance by supplying a gate drive signal to both said first FET drive transistor and said second FET drive transistor.

10. The motor controller of claim 6, wherein:

said sensing drive circuit has said high ON resistance five times said normal ON resistance.

* * * * *